United States Patent
Chidambarrao et al.

(10) Patent No.: US 7,102,205 B2
(45) Date of Patent: Sep. 5, 2006

(54) BIPOLAR TRANSISTOR WITH EXTRINSIC STRESS LAYER

(75) Inventors: Dureseti Chidambarrao, Weston, CT (US); Gregory G. Freeman, Hopewell Junction, NY (US); Marwan H. Khater, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/931,660

(22) Filed: Sep. 1, 2004

(65) Prior Publication Data

US 2006/0043529 A1    Mar. 2, 2006

(51) Int. Cl.
*H01L 27/082* (2006.01)
*H01L 27/102* (2006.01)
*H01L 29/70* (2006.01)
*H01L 31/11* (2006.01)

(52) U.S. Cl. .................. 257/592; 257/565; 257/E29.19
(58) Field of Classification Search ................. 257/592
See application file for complete search history.

(56) References Cited

U.S. PATENT DOCUMENTS

| | | | | |
|---|---|---|---|---|
| 4,875,084 A | * | 10/1989 | Tohyama | 257/436 |
| 6,465,317 B1 | * | 10/2002 | Marty | 438/321 |
| 2003/0199153 A1 | * | 10/2003 | Kovacic et al. | 438/479 |
| 2004/0092085 A1 | * | 5/2004 | Kanzawa et al. | 438/479 |
| 2004/0198010 A1 | * | 10/2004 | Koumoto et al. | 438/312 |
| 2005/0035470 A1 | * | 2/2005 | Ko et al. | 257/900 |
| 2005/0104160 A1 | * | 5/2005 | Ahmed et al. | 257/565 |

* cited by examiner

*Primary Examiner*—Tu-Tu Ho
(74) *Attorney, Agent, or Firm*—Howard M. Cohn; H. Daniel Schnurmann (57) ABSTRACT

A method of increasing mobility of charge carriers in a bipolar device comprises the steps of: creating compressive strain in the device to increase mobility of holes in an intrinsic base of the device; and creating tensile strain in the device to increase mobility of electrons in the intrinsic base of the device. The compressive and tensile strains are created by forming a stress layer in close proximity to the intrinsic base of the device. The stress layer is at least partially embedded in a base layer of the device, adjacent an emitter structure of the device. The stress layer has different lattice constant than the intrinsic base. Method and apparatus are described.

6 Claims, 10 Drawing Sheets

BIPOLAR TRANSISTOR WITH EXTRINSIC STRESS LAYER

BACKGROUND OF THE INVENTION

The invention relates to semiconductor device fabrication and, more particularly, to techniques for enhancing the performance of bipolar devices.

A bipolar device is a semiconductor device, the operation of which is based on the use of both majority and minority carriers (also referred to as "charge carriers"). The majority and minority carriers are either electrons or holes, depending on the polarity of the device.

An example of a bipolar device is the bipolar junction transistor (BJT) which is a transistor having three semiconductor regions referred to as emitter, base and collector. The emitter is a very high conductivity region which acts as a source of free carriers which are injected into the adjacent base region. The collector is a region which collects carriers from the base. The base region is sandwiched between the emitter and collector regions and generally controls the flow of free carriers between the emitter and the collector. A lesser flow of carriers of opposite polarity to those flowing from emitter to collector flows from the base to the emitter.

A conventional BJT is fabricated using one semiconductor material (Si) with differently doped regions. A heterojunction bipolar transistor (HBT) utilizes more than one semiconductor material, taking advantage of the different properties (e.g., bandgap) of the different materials—for example, SiGe in combination with Si. The additional (other than Si) material is formed as an epitaxial layer, typically using MBE (molecular beam epitaxy), RTCVD (rapid-thermal chemical vapor deposition), or LPCVD (low-pressure chemical vapor deposition) techniques.

A bipolar transistor comprises an emitter layer (or region) containing an impurity of a first conductivity type, a base layer (or region) containing an impurity of a second conductivity type, and a collector layer (or region) containing the impurity of the first conductivity type.

Bipolar transistors are typically of two distinct types, or polarity—either npn (having n-type emitter and collector, and having p-type base), or pnp (having p-type emitter and collector, and having n-type base). The "type" (p or n) is determined by impurities which are implanted or deposited during epitaxy into the semiconductor material. The impurity for p-type is boron (B) and for n-type, phosphorous (P), arsenic (As), antimony (Sb).

For a npn type bipolar transistor, the free carriers injected from the emitter are electrons, and the carriers flowing from the base to emitter are holes. For a pnp type bipolar transistor, carrier types are the opposite. Often, electrons are preferred as the majority charge carriers rather than holes, since for carrier mobility ($\mu$) $\mu_n > \mu_p$, and for saturation velocity (v) $v_n > v_p$. Hence, n-type bipolar devices are typically preferred, where possible.

Figure 1:
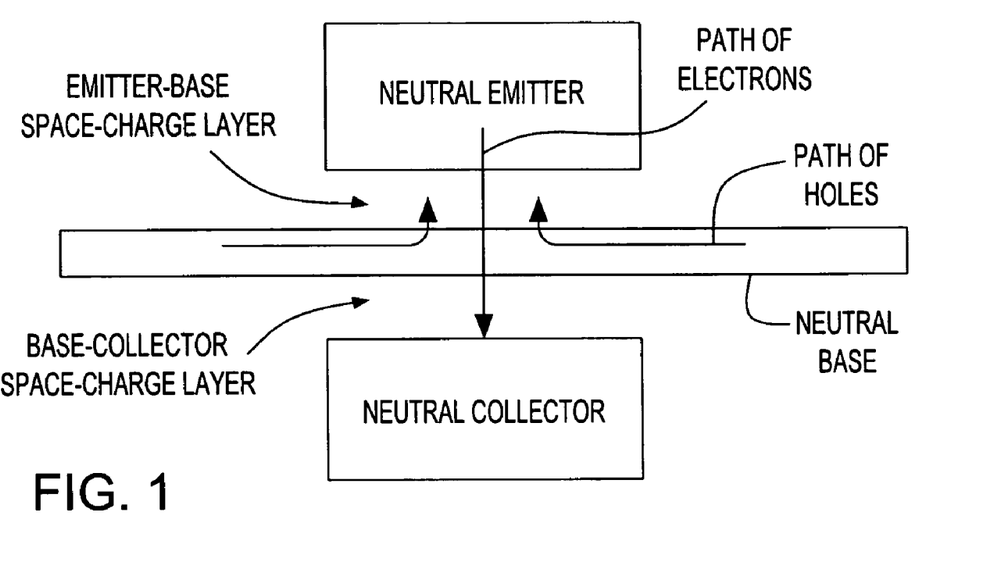
FIG. 1 is a schematic illustration of a BJT of the prior art, illustrating a generalized bipolar transistor structure and some fundamental principles of its operation, particularly charge flow.

FIG. 1 illustrates, generally, an npn type BJT of the prior art comprising a neutral emitter, a neutral collector, and a neutral base disposed between the neutral emitter and neutral collector, illustrating the path of electrons from neutral emitter to neutral collector, via the base, and illustrating the path of holes from the neutral base to the neutral emitter. An emitter base space charge layer (region) is formed between the neutral emitter and the neutral base. A base collector space charge layer (region) is formed between the neutral base and the neutral collector. (For a pnp polarity BJT holes traverse between neutral emitter and neutral collector and electrons traverse between neutral base to neutral emitter).

Lattice strain is known to affect carrier mobility and saturation velocity. Various methods have been shown to cause strain in field effect transistors (FETs). For instance, films which cause tensile strain in the direction of current flow (and sometimes in the direction perpendicular to the direction of current flow) can improve the electron mobility and saturation velocity in FETs. It should be understood that FETs operate fundamentally differently than BJTs. For one thing, there is charge flow in only one direction, which is parallel to the wafer surface. In addition, FETs have a single carrier (electrons for N FET and holes for P FET), and so the application of lattice strain is straightforward to create strain in principally one direction for the single carrier type.

Some examples of employing strain techniques in FETs can be found in the following articles:

"A 90 nm High Volume Manufacturing Logic Technology Featuring Novel 45 nm Gate Length Strained Silicon CMOS Transistors", T. Ghani et al., Portland Technology Development, Intel Corp., Hillsboro, Oreg., 0-7803-7873 Mar. 3, 2003, IEEE describes the details of a strained transistor architecture which is incorporated into a 90 nm logic technology on 300 mm wafers. The strained PMOS transistor structure features an epitaxially grown strained SiGe film embedded in the source drain regions. Dramatic performance enhancement relative to unstrained devices are reported. Ghani FIG. 1 shows a PMOS transistor with a strained epitaxial SiGe film embedded into the source drain region to induce compressive strain in the channel region.

"Enhanced Hole Mobilities in Surface-channel Strained-Si p-MOSFETs", K. Rim et al, Solid State Electronics Laboratory, Stanford University, Stanford, Calif. 94305, 0-7803-2700-4, (c)1995, IEEE describes the strain dependence of the hole mobility in surface-channel p-MOSFETs employing pseudomorphic, strained-Si layers. The hole mobility enhancement is observed to increase roughly linearly with the strain as the Ge content in the relaxed $Si_{1-x}Ge_x$ buffer layer increases.

"Fabrication and Mobility Characteristics of Ultra-thin Strained Si Directly on Insulator (SSDOI) MOSFETs", K. Rim et al, T.J. Watson Research Center, Yorktown Heights, N.Y. 10598 0-7803-7873 3/03, IEEE discloses a tensile-strained Si layer transferred to form an ultra-thin (<20 nm) strained Si directly on insulator (SSDOI) structure. MOSFETs were fabricated, and electron and hole mobility enhancements were demonstrated on strained Si directly on insulator structures with no SiGe layer present under the strained Si channel.

BRIEF DESCRIPTION (SUMMARY) OF THE INVENTION

Circuits benefit from ever increasing performance of the transistors. As mentioned above, MOSFET devices are finding increased performance from strained silicon lattice, which improves low field carrier mobility and thus the drive current in those devices. However, to the inventors' knowledge, external strain has not yet been engineered into bipolar devices for increased performance. Wherein there are many methods so far described to impart strain into MOSFET devices, this field is largely unexplored for bipolar devices.

Bipolar device (BJT) performance is partly limited by carrier transit time through the space-charge regions and through the neutral base. Low field mobility and saturation velocity enhancements will benefit this transit time. The performance is also limited by extrinsic resistances in the base, emitter and collector regions. These resistance values are dominated by low field electron and hole mobility and will be affected by strain in the device. Compressive strain will benefit hole mobility, and tensile strain will benefit electron mobility. Applied in the correct locations in the device, strain will significantly improve performance.

Referring to FIG. 1, the performance of an npn transistor could benefit from improving hole mobility in the lateral direction and improving electron mobility in vertical direction. In the opposite polarity case, a pnp transistor could benefit from improving electron mobility in the lateral direction and improving hole mobility in vertical direction.

According to the invention, generally, for an npn bipolar device electron mobility in the vertical direction is improved by creating vertical tensile strain and hole mobility in the lateral direction is improved by creating lateral compressive strain. For a pnp bipolar device hole mobility in the vertical direction is improved by creating vertical compressive strain and electron mobility in the lateral direction is improved by creating lateral tensile strain.

According to the invention, for an npn bipolar device tensile strain is applied to the intrinsic portion of the device (including the emitter, base and collector) in the direction of electron flow (vertical in the diagrams), and compressive strain is applied in the direction of hole flow (lateral in the diagrams), because holes flow principally in this direction within the base layers and improved hole mobility with compressive strain beneficially affects the resistance of the base terminal.

According to the invention, generally, for both npn and pnp BJTs, a structure is formed wherein both tensile and compressive strain is created in the intrinsic base (under the emitter) of the device through a stress layer which is formed over the base layer, adjacent the intrinsic base (on either side of the emitter). For an npn BJT, the stress layer causes tensile strain in the vertical direction thereby increasing electron mobility, and causes compressive stress in the horizontal direction, thereby increasing hole mobility. For a pnp BJT, the stress layer causes compressive strain in the vertical direction thereby increasing hole mobility, and causes tensile stress in the horizontal direction, thereby increasing electron mobility.

Generally, the stress layer is at least partially embedded in the underlying base layer. The intrinsic base (see FIG. 4B, 421) is typically silicon (Si) or silicon germanium (SiGe). For an npn BJT, the stress layer needs to be larger in lattice constant than the intrinsic base. For example, if the intrinsic base is silicon, then the stress layer can be silicon germanium having a larger lattice constant than the intrinsic base. For example, if the intrinsic base is silicon germanium (SiGe), then the stress layer can be SiGe with a higher Ge content having a larger lattice constant than the intrinsic base. The stress layer creates vertical tensile strain in the intrinsic base, increasing electron mobility in the intrinsic base. The stress layer creates horizontal compressive strain in the intrinsic base, increasing hole mobility in the intrinsic base.

According to the invention, a method of increasing mobility of charge carriers in a bipolar device comprises the steps of: creating horizontal compressive strain in the device to increase mobility of holes in an intrinsic base of the device; and creating vertical tensile strain in the device to increase mobility of electrons in the intrinsic base of the device. The compressive and tensile strain are created by forming a stress layer in close proximity to the intrinsic base of the device. The stress layer is at least partially embedded in a base layer of the device, adjacent an emitter structure of the device.

For an npn bipolar device, the stress layer has a larger lattice constant than the intrinsic base. The intrinsic base may comprise silicon, in which case the stress layer comprises a silicon germanium (SiGe). The intrinsic base may comprise silicon germanium (SiGe), in which case the stress layer comprises a SiGe with a higher Ge content.

For a pnp bipolar device, the stress layer has a smaller lattice constant than the intrinsic base. The intrinsic base may comprise silicon, in which case the stress layer comprises a Silicon Carbon (SiC). The intrinsic base may comprise silicon germanium (SiGe), in which case the stress layer comprises a material selected from the group consisting of SiGe with a lower Ge content, or silicon, or silicon carbon.

BRIEF DESCRIPTIONS OF THE DRAWINGS

The structure, operation, and advantages of the present invention will become further apparent upon consideration of the following description taken in conjunction with the accompanying FIGs (FIGs.). The FIGs are intended to be illustrative, not limiting.

Certain elements in some of the FIGs may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various FIGs (FIGs.) of the drawing, in which case typically the last two significant digits may be the same, the most significant digit being the number of the drawing figure (FIG).

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They may be included to provide a sense of proportion. Generally speaking, it is the relationship between various elements, where they are located, their contrasting compositions, and sometimes their relative sizes that is of significance.

Figure 2A:
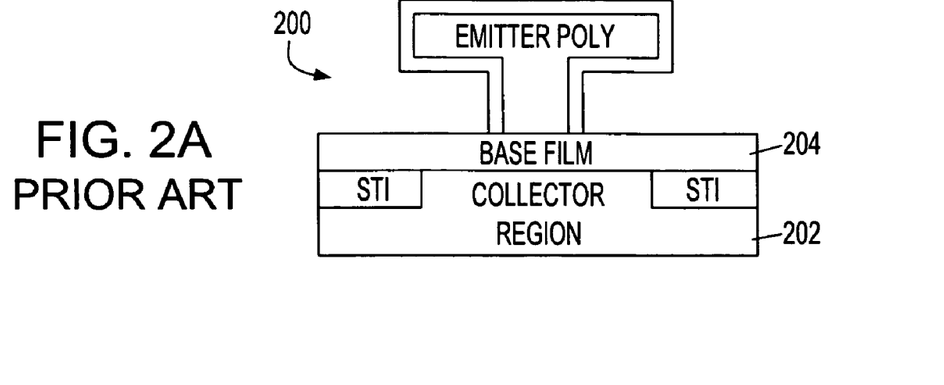
FIG. 2A is a simplified cross-sectional view of a BJT, according to the prior art.

FIG. 2A illustrates a BJT 200 of the prior art, formed in a semiconductor substrate (not specifically shown). The BJT comprises a collector region 202 which is defined between shallow trench isolation (STI) region, a base film 204 disposed atop the collector region 202 and an emitter structure 206 formed atop the base layer 204. The emitter structure 206 is typically formed of polysilicon. Spacers are formed on either both sides of the emitter structure. The device 200 is finished with steps (e.g., contact formation, etc.) well known to those knowledgeable in the state of the art and therefore require no further detailed discussion.

Exemplary dimensions for the elements of the BJT 200 are:
- for the base film, a thickness (vertical in the figure) of: 10 to 50 mm.
- for the collector region, a width (horizontal in the figure, between the STIs) of: 100 to 200 nm.
- for the spacers, a width/thickness (horizontal in the figure) of: 10 to 50 nm.
- for the stress layer, a thickness (vertical in the figure) of: 10 to 50 nm. (Since the stress layer may be only partially embedded, as described below, it can have the same or even greater thickness than the underlying base film).
- for the emitter structure, an overall height of: 100 to 200 nm.
- for the width of the emitter: 100 to 200 nm.

According to the invention, a bipolar transistor is fabricated with an extrinsic "stress layer" for enhancing electron and hole mobility in the intrinsic base. The stress layer (which may be SiGe) creates both tensile and compressive strain in the device. Generally, the stress layer is at least partially embedded in the underlying base layer, and has a different lattice constant than the underlying base layer, thereby causing stress in the regions next to and below it. Of particular interest are the tensile and compressive strains created in the intrinsic base region below the emitter which improve electron and hole mobility, respectively.

Figure 2B:
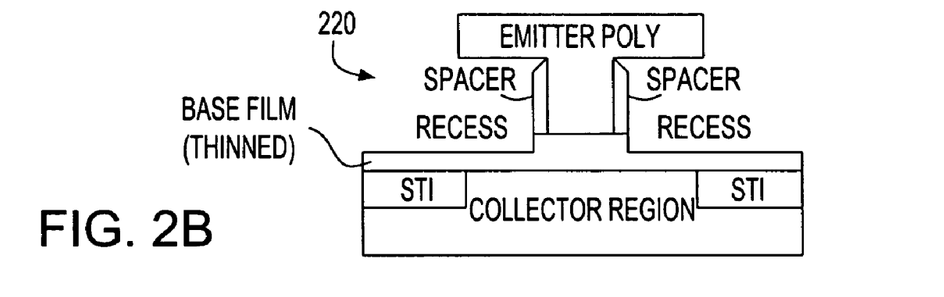
FIGS. 2B and 2C are simplified cross-sectional view of a BJT, according to an embodiment of the present invention.
Figure 2C:
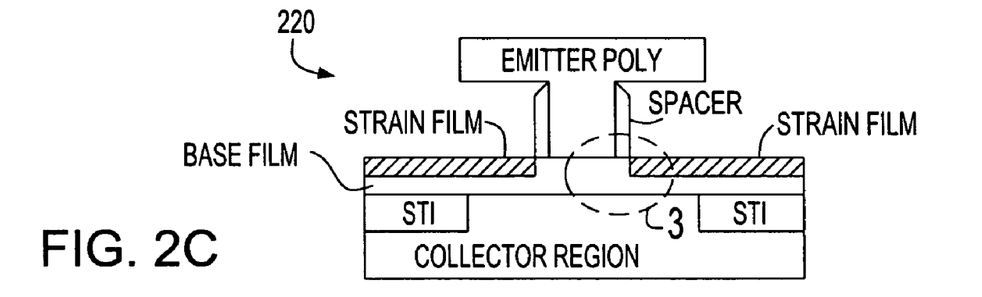

FIGS. 2B and 2C illustrate an embodiment of a BJT 220, according to the invention. A collector region 202 is defined in the substrate between two STI region, a base film 204 is disposed atop the collector region, an emitter structure 206 is disposed atop the base film, and spacers are formed on the sides of the emitter structure. Typical dimensions for these elements can be as in the BJT 200.

Recesses are formed in the base film, on both sides of the emitter structure (i.e., adjacent the sidewall spacers) using any suitable etching process. The recesses are suitably approximately 10 to 25 nm in depth (vertical, in the figure), and extend laterally beyond the collector region and over the STI. The thus "thinned" layer of the base film has a thickness of approximately 25 to 45 nm.

The recesses are then filled with epitaxially grown stress layer using known processes. This includes overfilling the recesses. The stress layer thus formed may have a thickness of approximately 10–100 nm (essentially equal to the depth of the recesses). This stress layer may be doped to link with the intrinsic base under the emitter structure.

The final structure, shown in FIG. 2C includes emitter polysilicon and may include a raised doped extrinsic base for lower resistance.

Figure 3:
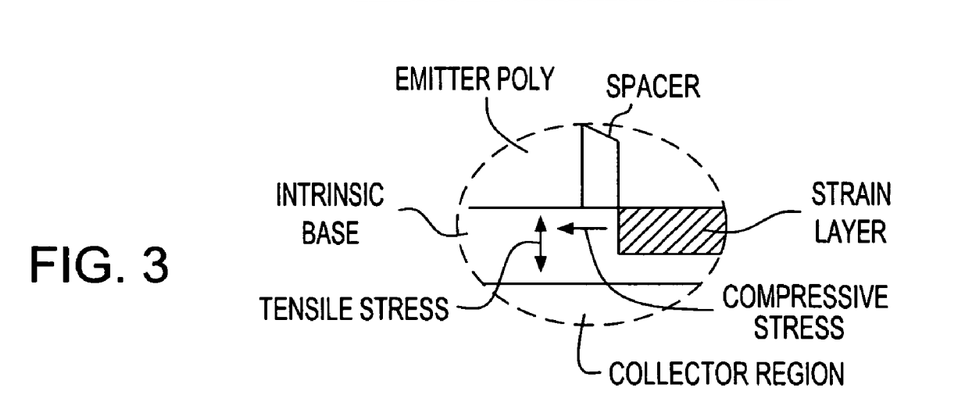
FIG. 3 is a magnified view of a portion of FIG. 2C showing.

FIG. 3 illustrates the strain in the final structure of FIG. 2C. The SiGe layer ("stress layer") creates a tensile strain in the vertical direction, parallel to the direction of electron flow as shown by the vertical double-headed arrow in FIG. 2D. (The electron flow is shown by the vertical single-headed arrow in FIG. 1). The tensile strain will enhance electron mobility and reduce transit time and increase current and transconductance. The stress layer also creates a compressive strain perpendicular to the direction of electron flow as shown by the horizontal single-headed arrow in FIG. 3. (There would be another inward-pointing arrow under the left side of the emitter, if it were shown in the view of FIG. 3). This compressive strain enhances hole mobility in the intrinsic base region.

An Exemplary Embodiment

FIGS. 4A to 4J illustrate a sequence of steps used to form an exemplary embodiment of a BJT 400, according to the invention. FIG. 5A illustrates a complete BJT, formed according to the steps illustrated in FIGS. 4A to 4J. FIG. 5B illustrates an alternate embodiment of a complete BJT, formed according to the steps illustrated in FIGS. 4A to 4J.

Figure 4A:
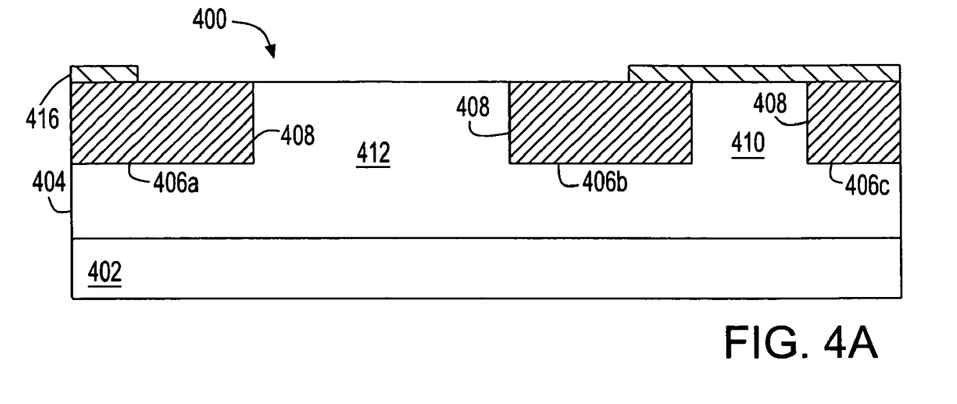
FIGS. 4A to 4J are cross-sectional views of a sequence of steps used to fabricate a BJT, according to the invention.
Figure 5A:
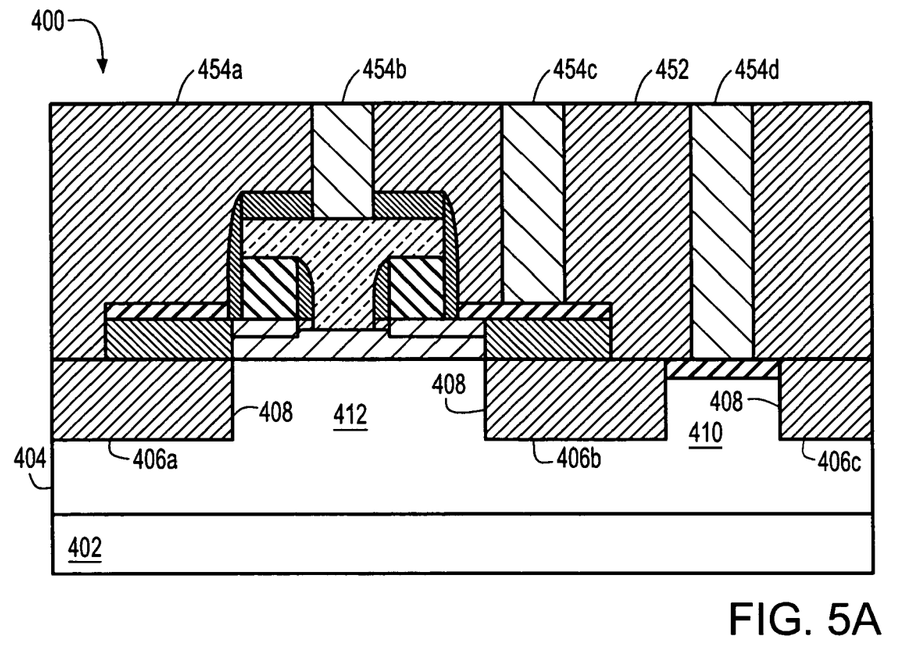
FIG. 5A is a cross-sectional view of a complete BJT, formed according to the steps illustrated in FIGS. 4A to 4J, according to the invention.
Figure 5B:
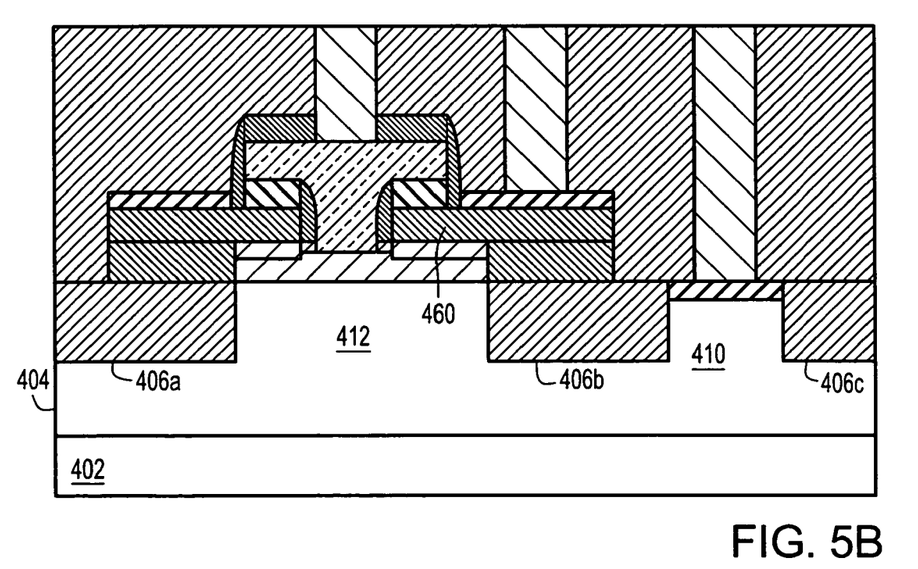
FIG. 5B is a cross-sectional view of a complete BJT, formed according to the steps illustrated in FIGS. 4A to 4J, according to an alternate embodiment of the invention.

As shown in FIG. 4A, a plurality of spaced-apart shallow trenches 406a, 406b, 406c (collectively, 406) are formed in a lightly doped (n−) epitaxial layer 404 of silicon semiconductor material which has been deposited on a heavily doped (n+) single crystal silicon semiconductor subcollector or substrate 402. The shallow trench isolation 406 is filled with an isolation oxide 408. The shallow trench isolation (STI) oxide 408 is suitably formed using well-known conformal oxide deposition and oxide polishing steps or other methods to bring the surface of oxide 408 to the same level as the surface of epitaxial layer 404. The rightmost upstanding portion or mesa 410 of layer 404, between trenches 406b and 406c, will ultimately form the subcollector reach through to substrate 402 which is the subcollector of the finished BJT. Leftmost upstanding portion or mesa 412 of layer 404, between the trenches 406a and 406b, will ultimately form the collector of the finished BJT.

Deep trench isolation (not shown) may optionally be formed. CMOS layers (not shown) may optionally be formed. (See, e.g., U.S. Pat. No. 6,448,124).

A layer of etch-stop material (preferably silicon dioxide) 416 and a thin layer of polysilicon (not shown) are deposited on the surfaces of mesas 410 and 412 and on isolation oxide 408. This set of layers provide protection of mesa 410 from later processing. A region corresponding to region 412 and overlapping STI 406 is defined through photolithography and the thin polysilicon layer is etched, stopping on the thin etch stop layer 416. Layer 416 is then etched, preferably with a wet etch process such as dilute HF, exposing the surface of mesa 412 and portions of the adjacent oxides 408.

Figure 4B:
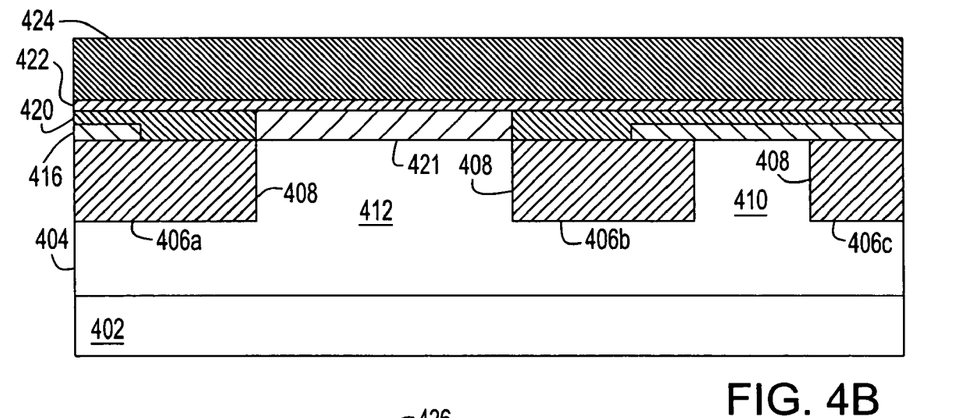

Next, as shown in FIG. 4B, a layer 420 of silicon semiconductor material is deposited on the surface of mesa 412 and on exposed portions of adjacent isolation oxide 408 using a nonselective epitaxial deposition technique. The layer 420 deposits as a polycrystalline material on the oxide 408, as single crystal material (designated 421) on the surface of mesa 412, and as polysilicon on the thin polysilicon layer remaining over 416. The layer 420 is doped to have a p type conductivity in an npn bipolar device and an n type in a pnp bipolar device. The portion 421 of the layer 420 will form the base of the BJT. The layer 420 may also include an alloy of Silicon Germanium (SiGe) in order to form a heterojunction bipolar transistor (HBT). This layer 420/421 has a thickness of approximately 10 to 50 nm, over the mesa 412 (in the openings), and over the layers 416 and 418.

Layer 420 (421) may be deposited using any well-known epitaxial deposition technique which provides the desired polycrystalline and single crystal regions over oxide regions 408 adjacent the mesa 412 and over the mesa 410, respectively. A preferred approach is to deposit layer 420/421 using a low temperature epitaxial (LTE) technique. Boron or phosphorus may be used as the p type or n type conductivity dopant, respectively, and may have a doping concentration of $5\times10^{18}$ to $5\times10^{19}$ cm$^{-3}$. In this way, the deposited layer 420/421 is formed of boron or phosphorus doped silicon or silicon/germanium by simply introducing the appropriate constituents during the deposition step in a well-known way.

After the deposition of layer 420/421, layers of oxide 422 and nitride 424 are deposited. These layers may be deposited in manners well-known to those skilled in the semiconductor fabrication art. The oxide layer 422, may alternatively be thermally grown using well-known prior art techniques. The oxide layer 422 has an exemplary thickness of approximately 10 to 20 nm. The nitride layer 424 has an exemplary thickness of approximately 100 to 200 nm.

Figure 4C:
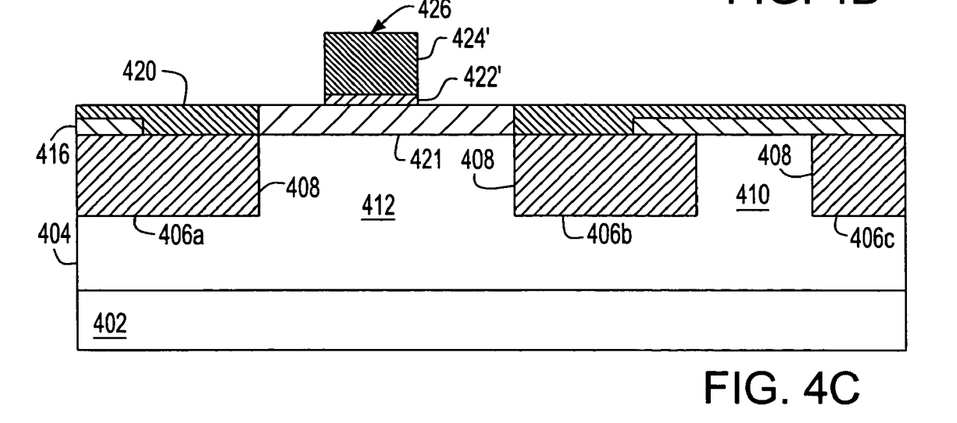

Next, as shown in FIG. 4C, the nitride 424 is patterned using lithography and etched, stopping on the oxide 422. Then the oxide 422 is stripped, leaving an emitter mandrel structure 426. The emitter mandrel 426 has an exemplary height of approximately 100 to 200 nm, and an exemplary width of approximately 100 to 200 nm, and is approximately centered over the intrinsic base 421 which is atop the mesa 412. The emitter mandrel 426 comprises etched nitride 424 (shown in this figure as 424') and etched oxide 422 (shown in this figure as 422').

Figure 4D:
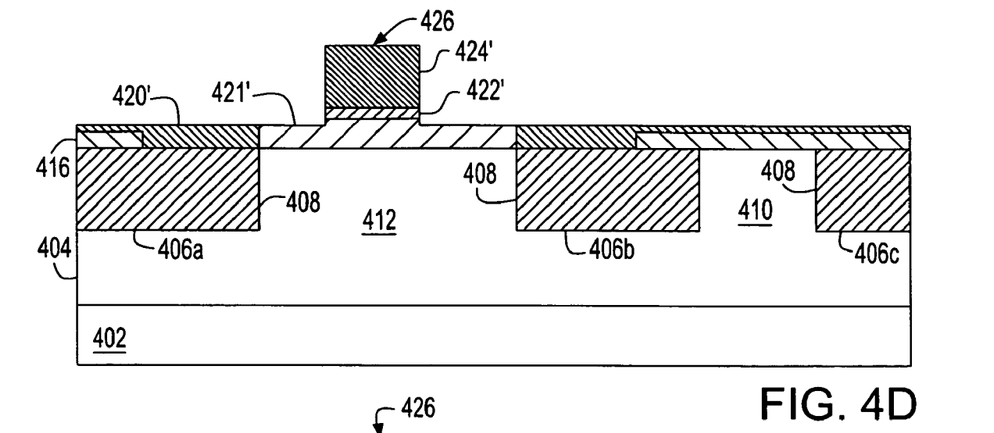

Next, as shown in FIG. 4D, the intrinsic base 421 is etched with RIE (reactive ion etching) or wet etch using the emitter mandrel 426 as a mask. This results in a thinned intrinsic base 421 (shown in this figure as 421'). This also results in thinning of the silicon layer 420 (shown in this figure as 420'). The thinned SiGe layer 421' becomes the intrinsic base.

Figure 4E:
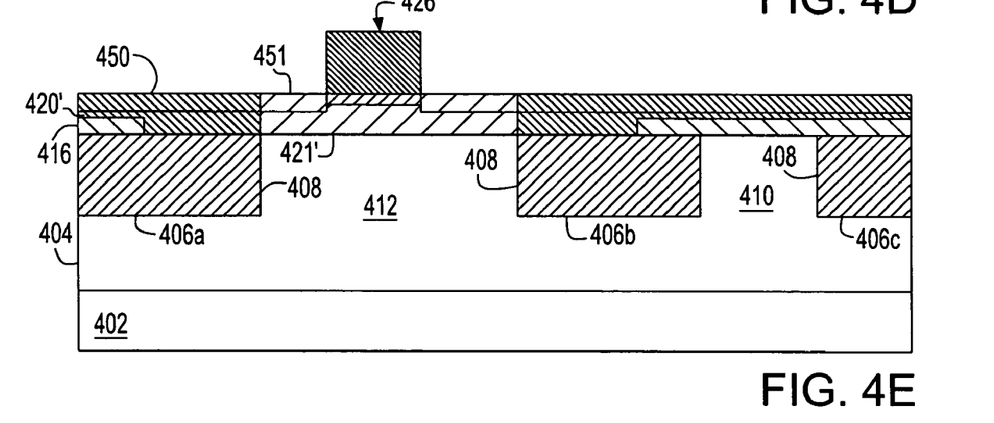

Next, as shown in FIG. 4E, a stress layer 450 is epitaxially grown. The stress layer is shown as 450 over the silicon 420 and as 451 over the SiGe 421'. The stress layer is grown back up to at least the height of the oxide 422, including beyond the original height of the thinned layer 421', in either case it is embedded. The recess dimension is approximately 5–25 nm. The stress layer thickness can be approximately 5 to 50 nm. The stress layer has a larger lattice constant than the intrinsic base for npn bipolar device. In this case, for a silicon base 421' the stress layer is silicon germanium (SiGe), whereas for a SiGe base 421', the stress layer is SiGe with a higher Ge content. On the other hand, the stress layer has a smaller lattice constant than the intrinsic base 421' for pnp bipolar device. In this case, for a silicon base 421' the stress layer is Silicon Carbon (SiC), whereas for a SiGe base 421', the stress layer is SiGe with a lower Ge content, or silicon, or silicon carbon.

Figure 4F:
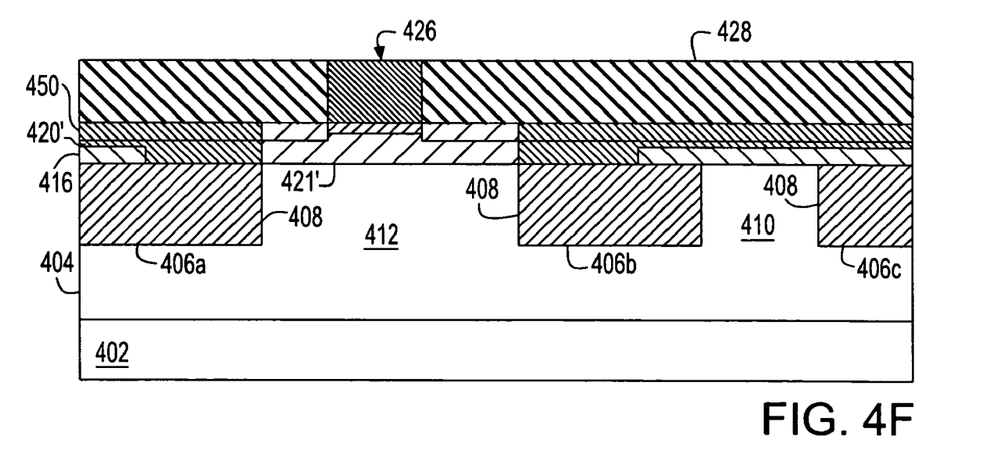

Next, as shown in FIG. 4F, oxide 428 is deposited and planarized. The oxide 428 has the same thickness (vertical in the figure) as the nitride 424 of the emitter mandrel 426.

Figure 4G:
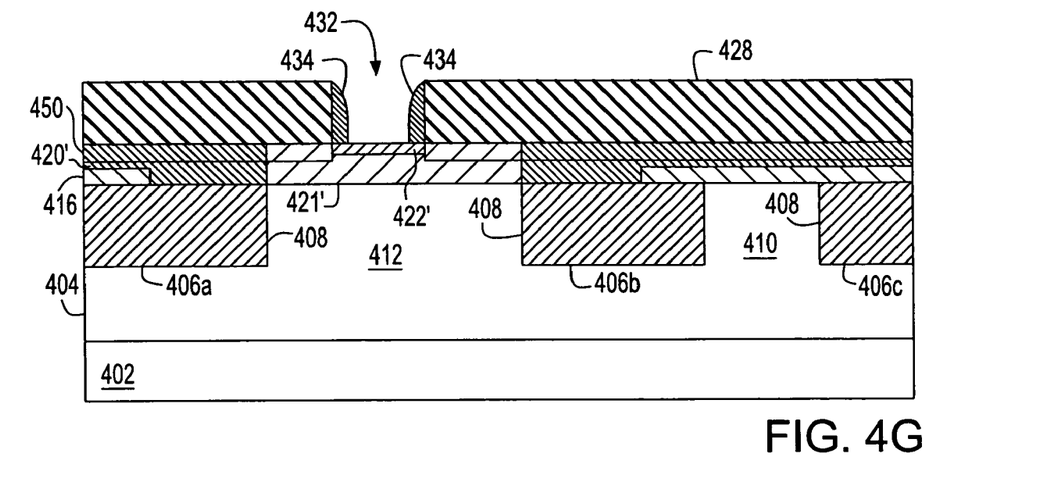

Next, as shown in FIG. 4G, using selective etching, the nitride 424 of the emitter mandrel 426 is removed, using the underlying oxide 422' as an etch stop resulting in an "emitter" opening 432 in the oxide 428. In this step, the opening 432 extends downward to the oxide 422'. The opening 432 has a width (horizontal in the figure) which is equal to the width of the emitter mandrel 426. Nitride spacers 434 are formed on the sidewalls of the opening 432. The spacers 434 have an exemplary thickness (horizontal in the figure) of approximately 10 to 50 nm. This results in an emitter opening having an exemplary width of 100 to 200 nm between the sidewall spacers 434.

Figure 4H:
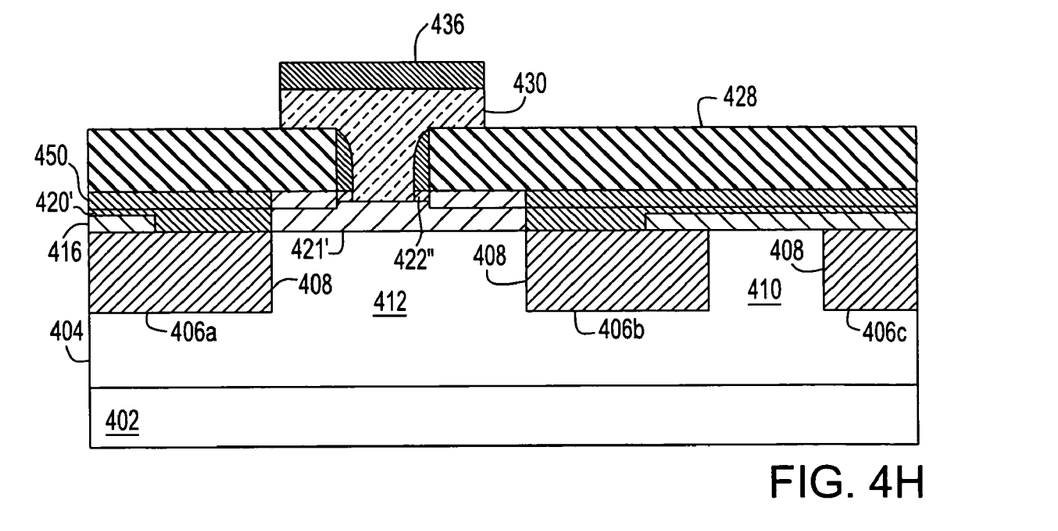

Next, as shown in FIG. 4H, the underlying oxide 422' is etched to expose the base layer 421' in the emitter opening 432. Then polysilicon is deposited. A (nitride) hard mask 436 is deposited. The nitride hard mask 436 is patterned using lithography and etched. The nitride hard mask 436 is then used to etch the polysilicon resulting in the emitter structure 430 shown in FIG. 4H. The vertical (upright) portion of the T shaped emitter structure is in the emitter opening 432. The horizontal (lateral) portion of the T shaped emitter structure extends over the oxide 428.

Figure 4I:
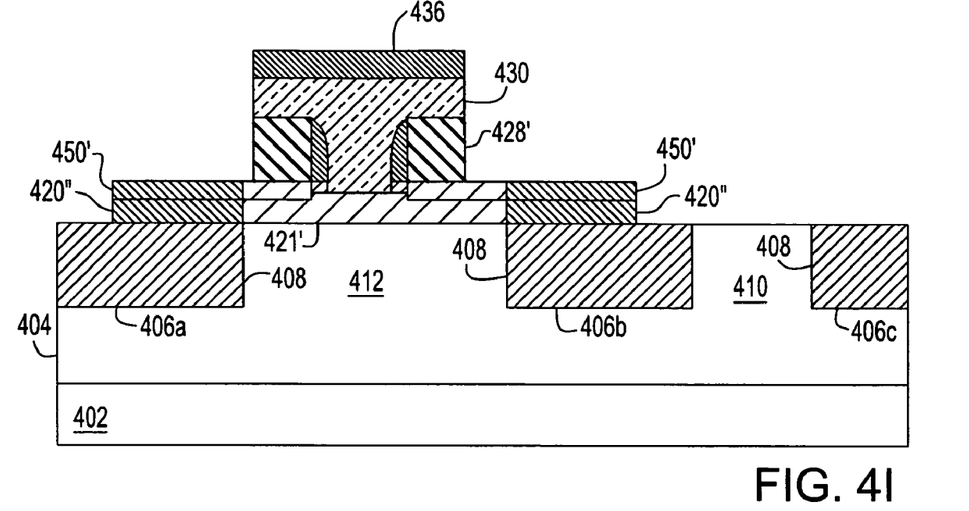

Next, as shown in FIG. 4I, the oxide 428 is etched from all but under the overhanging (horizontal) portion of the emitter structure, using wet or RIE etch process. The remaining oxide is shown in this figure as 428'. Also shown in FIG. 4I, the extrinsic base region layer 420"/450' is defined through oxide hard mask deposition, lithography, and RIE etch of the base polysilicon stopping on oxide layer 416. Both hard mask oxide and oxide layer 416 are later removed resulting in the transistor structure shown in FIG. 4I.

Figure 4J:
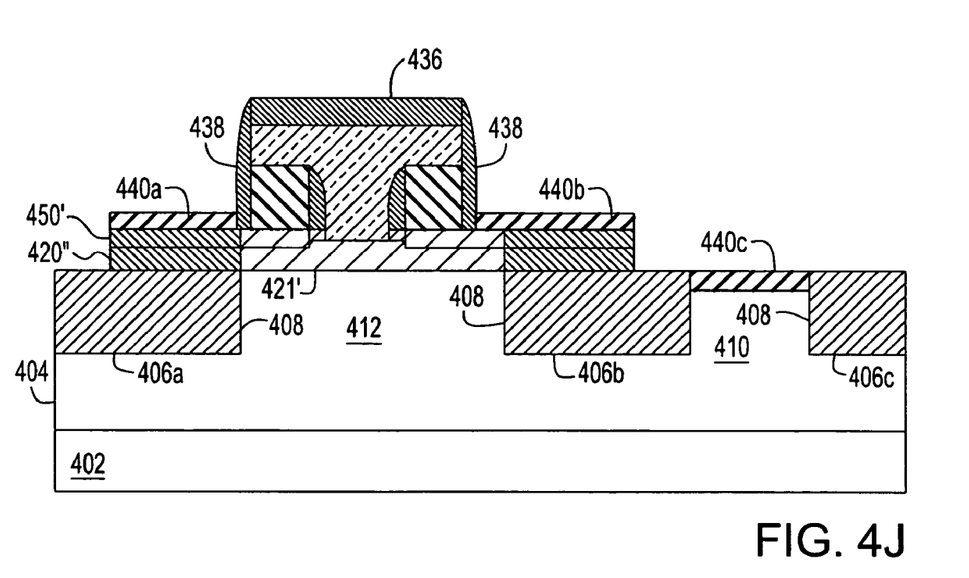

Next, as shown in FIG. 4J, nitride sidewall spacers 438 are formed on the overall structure of 436, 430, 428'. As also shown in FIG. 4J, a silicide layer is formed through well known processes of metal sputter deposition, reaction and conversion. The silicide forms only on exposed silicon. Silicide 440a forms on the portion of the SiGe/poly 450'/420" which is on the left side of the emitter 430. Silicide 440b forms on the portion of the SiGe/poly 450'/420" which is on the right side of the emitter 430. Silicide forms on the silicon which is exposed over the mesa 410, and not on the oxide layers 408 which are exposed adjacent the mesa 410.

In a final set of steps, shown in FIG. 5A, processing for the BJT device 400 is completed by depositing oxide dielectric 452 and forming contacts 454a, 454b, and 454c, to the emitter, base and collector, respectively.

In an alternate embodiment, shown in FIG. 5B, an additional doped polysilicon layer 560 is deposited on top of the stress layer, which becomes part of the raised extrinsic base. In this case, the base resistance can be further reduced by increasing the doping level in the polysilicon layer 560 without an increase in the parasitic collector-to-base capacitance. More specifically, the crystalline region of the strain SiGe layer reduces dopants diffusion from the polysilicon layer 560 to the collector region 412. The reduced dopant diffusion is a result of the lower diffusion coefficient of Boron in SiGe compared to Si.

Simulation Results

Figure 6:
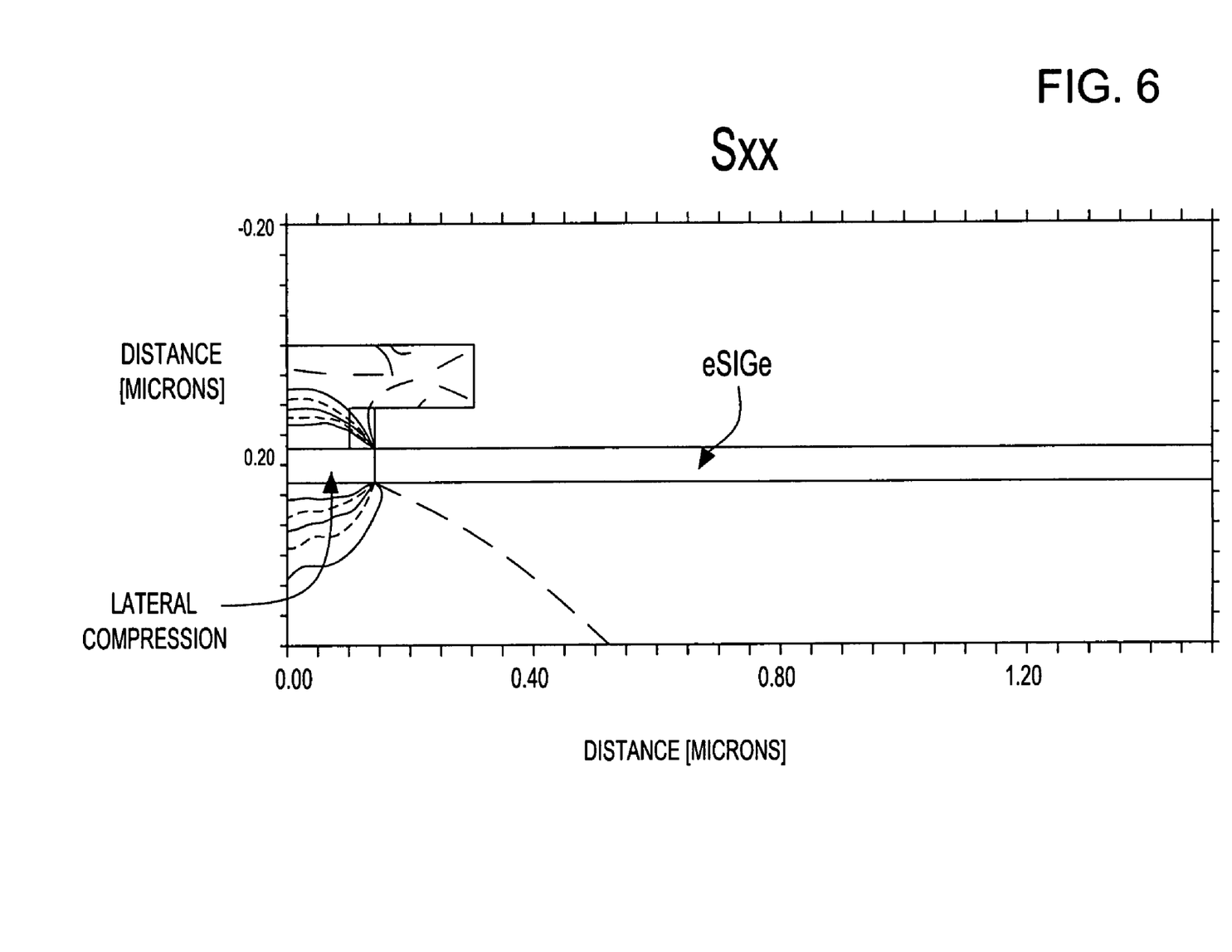
FIG. 6 is a diagram showing lateral stress in a BJT, according to the invention.
Figure 7:
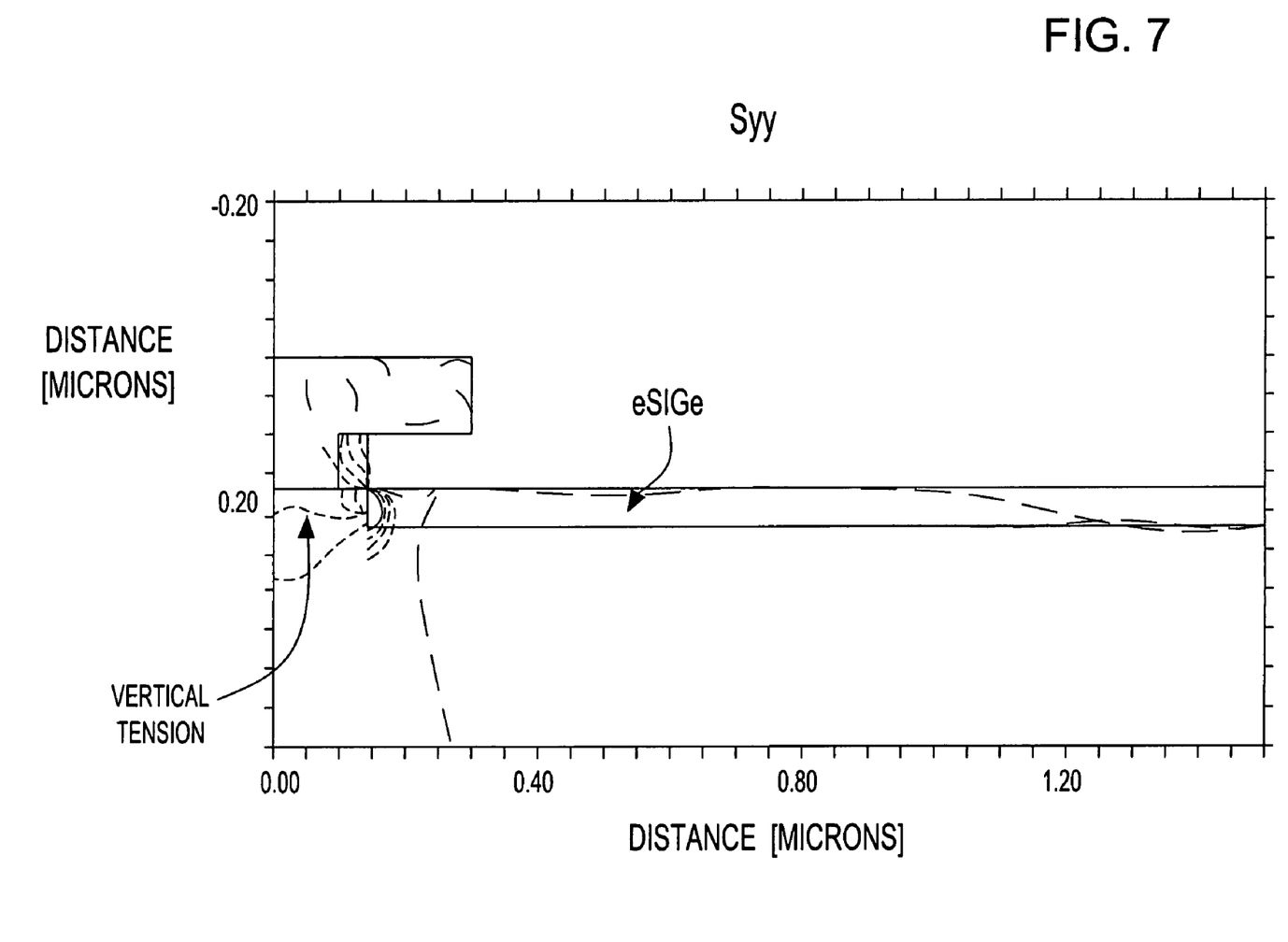
FIG. 7 is a diagram showing vertical stress in the BJT of FIG. 6, according to the invention.
Figure 8:
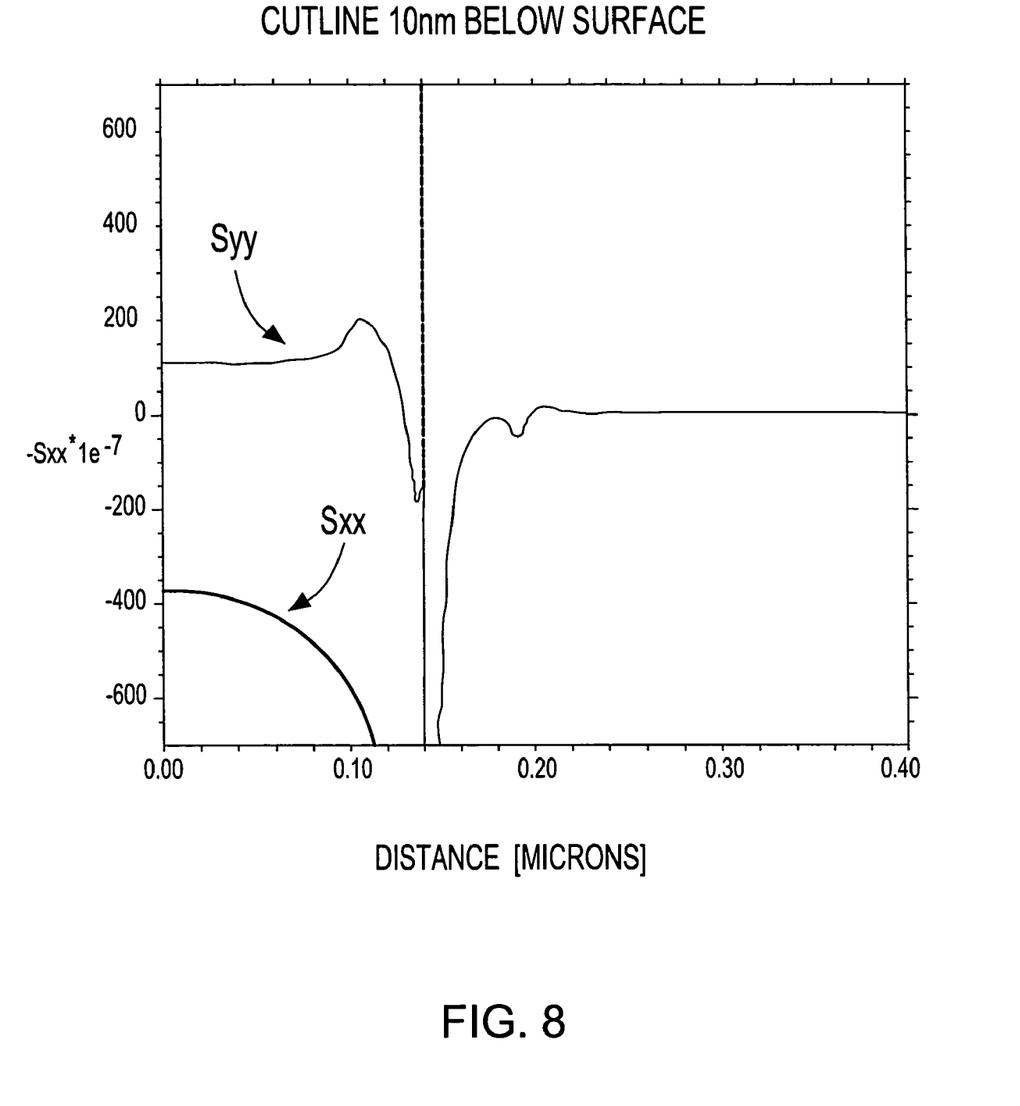
FIG. 8 is a graph illustrating stress in the BJT of FIG. 6, according to the invention.

The simulated effect of incorporating the stress layer is shown in FIGS. 6 to 8.

FIG. 6 shows a cross section of one half the device region of interest. Both axes show distances in microns. Only half the device is shown for simulation efficiency. The stress layer is atop the base film. Isocontour stress lines representing the lateral stress is shown in the structure.

Underneath the vertical portion of the emitter layer the lateral stress is compressive with the greatest quantity of stress near the interface between the base film and the emitter film. Underneath the stress layer the base layer is in tension, also with the greatest magnitude near the surface.

FIG. 7 shows the same structure as in FIG. 6, yet with the isocontour stress lines representing the vertical stress. Both axes show distances in microns. Here, the base film underneath the emitter films is in vertical tension, with the greatest magnitude near the surface.

FIG. 8 shows a graph of the stress at the "cutline" location 10 nm below the surface of the "eSiGe material" shown in FIGS. 6 and 7. The horizontal axis is distance in microns, the vertical axis is stress in MPa (where for example at 0 microns the Sxx is approximately −375 MPa). The positive tensile strain values represent tension while the negative values represent compression. The edge of the embedded SiGe, labeled as eSiGe in FIGS. 6 and 7, is located at 0.14 microns and is represented by the vertical dashed line in this figure.

The two sets of FIGS. 6 and 7 represent the lateral stress (SXX) and the vertical stress (SYY), and it can be seen that there is vertical tensile strain and lateral compressive strain within the intrinsic portion of this device.

This demonstrates that the stress layer has the desirable properties of creating vertical tensile strain and lateral compressive strain within the intrinsic portion of this device.

The invention has been described mainly in the context of an n type (npn: npn) BJT. In light of the teachings set forth hereinabove, one of ordinary skill in the art to which the invention most nearly pertains will recognize that for p type (pnp) BJTs, holes and electrons will be reversed (substituted for one another), tensile and compressive strain will be reversed, and a stress layer having lower lattice constant rather than a higher lattice constant than the intrinsic base will be utilized. Also, as discussed above, regarding higher (for npn) and lower (for pnp) Ge content. Therefore, as related to the present invention, these should be considered to be equivalents (for the purpose of interpreting scope of claim coverage).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. Bipolar device comprising:
   a collector region,
   a base layer disposed atop the collector region;
   an emitter structure formed atop the base layer;
   an extrinsic stress layer disposed adjacent the emitter structure and at least partially embedded in the base layer;
   the extrinsic stress layer is disposed over an intrinsic base formed in the base layer of the device; and
   for an npn bipolar device, the extrinsic stress layer has a larger lattice constant than the intrinsic base; and
   for a pnp bipolar device, the extrinsic stress layer has a smaller lattice constant than the intrinsic base.

2. Bipolar device comprising:
   a collector region,
   a base layer disposed atop the collector region;
   an emitter structure formed atop the base layer;
   an extrinsic stress layer disposed adjacent the emitter structure and at least partially embedded in the base layer;
   the extrinsic stress layer is disposed over an intrinsic base formed in the base layer of the device; and
   for an npn bipolar device, the extrinsic stress layer creates vertical tensile strain in the intrinsic base, below the emitter structure, increasing electron mobility in the intrinsic base and creates horizontal compressive strain in the intrinsic base, increasing hole mobility in the intrinsic base, below the emitter structure; and
   for a pnp bipolar device, the extrinsic stress layer creates vertical compressive strain in the intrinsic base region below the emitter structure, increasing hole mobility in the intrinsic base and creates horizontal tensile strain in the intrinsic base region below the emitter structure, increasing electron mobility in the intrinsic base.

3. The bipolar device of claim 1, wherein:
   the intrinsic base comprises silicon, and the extrinsic stress layer comprises a material selected from the group consisting of silicon germanium and silicon carbon.

4. The bipolar device of claim 1, wherein:
   the intrinsic base comprises silicon germanium (SiGe), and the extrinsic stress layer comprises a material selected from the group consisting of SiGe with different Ge content, or silicon, or silicon carbon.

5. The bipolar device of claim 2, wherein:
   the intrinsic base comprises silicon, and the extrinsic stress layer comprises a material selected from the group consisting of silicon germanium and silicon carbon.

6. The bipolar device of claim 2, wherein:
   the intrinsic base comprises silicon germanium (SiGe), and the extrinsic stress layer comprises a material selected from the group consisting of SiGe with different Ge content, or silicon, or silicon carbon.

* * * * *